US006333264B1

(12) United States Patent
Cathey et al.

(10) Patent No.: US 6,333,264 B1
(45) Date of Patent: *Dec. 25, 2001

(54) SEMICONDUCTOR PROCESSING METHOD USING HIGH PRESSURE LIQUID MEDIA TREATMENT

(75) Inventors: David A. Cathey; Mark Durcan, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,116

(22) Filed: Sep. 2, 1998

(51) Int. Cl.$^7$ .................................................... H01L 21/44
(52) U.S. Cl. .......................... 438/677; 438/679; 438/680; 438/681
(58) Field of Search .................................. 438/151, 166, 438/487, 677, 679, 680, 681

(56) References Cited

U.S. PATENT DOCUMENTS

| | | | |
|---|---|---|---|
| 3,650,823 | * 3/1972 | Mead et al. | 117/201 |
| 4,581,108 | * 4/1986 | Kapur et al. | 204/37.1 |
| 5,434,107 | 7/1995 | Paranjpe | 437/225 |
| 5,489,372 | * 2/1996 | Hirano | 205/109 |
| 5,994,172 | * 11/1999 | Ohtari et al. | 438/151 |
| 6,006,763 | * 12/1999 | Mori et al. | 134/1.1 |
| 6,046,060 | 4/2000 | Budnaitis | 438/10 |
| 6,191,040 | 2/2001 | Glass | 438/692 |

OTHER PUBLICATIONS

Dixit, G.A., et al., "A Novel High Pressure Low Temperature Aluminum Plug Technology For Sub–0.5 μm Contact/Via Geometries", *I.E.E.E.*, p. 105; p. 208 (1994).

Butler, David, "Options for Multilevel Metallization", *Solid State Technology*, pp. S7–S10 (Mar. 1996), including attached Product Brochure and Product Information on "Forcefill Systems" by Electrotech Ltd., Bristol, UK.

Dixit, Girish, A., "Application of High Pressure Aluminum to ULSI Metallization", *Semiconductor International*, pp. 79–80, 82, 83–84 (Aug. 1995).

Burggraaf, Pieter, "Straightening Out Sputter Deposition-"*Semiconductor International*, pp. 69–70; 72, 74 (Aug. 1995).

* cited by examiner

*Primary Examiner*—David Nelms
*Assistant Examiner*—Renee' R. Berry
(74) *Attorney, Agent, or Firm*—Wells, St. John, Roberts, Gregory & Matkin, P.S.

(57) ABSTRACT

In accordance with one aspect of the invention, a semiconductor processing method of treating a semiconductor wafer provides a wafer within a volume of liquid. The wafer has some electrically conductive material formed thereover. The volume of liquid within the chamber with the wafer therein is established at a pressure of greater than 1 atmosphere and at a temperature of at least 200° C., and below and within 10% of the melting point of the electrically conductive material. In accordance with another aspect, the volume of liquid within the chamber with the wafer therein is established at a pressure of greater than 1 atmosphere. After establishing the pressure of greater than 1 atmosphere, the pressure of the volume of liquid is lowered to a point effective to vaporize said liquid and the vapor is withdrawn from the chamber. In accordance with still another aspect, a semiconductor processing method of increasing planarity of an outer surface on a substrate comprises exposing the outer surface to a volume of liquid at a pressure of greater than about 200 atmospheres. The invention has particular utility to more completely filling contact openings with electrically conductive material, and to increasing substrate planarity. A typical preferred treatment is expected to last anywhere from seconds up to ten minutes or more.

36 Claims, 2 Drawing Sheets

SEMICONDUCTOR PROCESSING METHOD USING HIGH PRESSURE LIQUID MEDIA TREATMENT

TECHNICAL FIELD

This invention relates to semiconductor processing methods of filling contact and other openings with electrically conductive material, and to semiconductor processing planarizing and other techniques.

BACKGROUND OF THE INVENTION

The invention primarily grew out of needs for making highly reliable, high density dynamic random access memory (DRAM) and other electrical contacts. Advanced semiconductor fabrication is employing increasing vertical circuit integration as designers continue to strive for circuit density maximization. Such typically includes multi-level metallization and interconnect schemes.

Electrical interconnect techniques typically require making electrical connection between metal or other conductive layers, or regions, which are present at different elevations within the substrate. Such interconnecting is typically conducted, in part, by etching a contact opening through insulating material to the lower elevation of a layer or conductive region. The significant increase in density of memory cells and vertical integration places very stringent requirements for contact fabrication technology. The increase in circuit density has resulted in narrower and deeper electrical contact openings between layers within the substrate, something commonly referred to as increasing aspect ratios. Such currently range from 1.5 to 5 and are expected to increase. Adequate contact coverage of electrically conductive materials ultimately placed within these deep and narrow contacts continues to challenge the designer in assuring adequate electrical connection between different elevation areas within the substrate.

As contact openings become narrower and deeper, it becomes more difficult for the artisan to completely fill the contact openings. An example of the problem is best understood with reference to the accompanying FIGS. 1 and 2. There illustrated is a semiconductor wafer fragment 10 comprised of a bulk substrate 12 and an overlying silicon dioxide layer 14, such as borophosphosilicate glass (BPSG). Bulk substrate 12 includes a dopant diffusion region 16 to which electrical connection is to be made. A contact opening 18 is provided through BPSG layer 14 to active area 16.

A thin layer 20 of titanium is deposited atop the wafer to within contact opening 18. Titanium layer 20 is provided to function as a silicide formation layer at the base of contact 18 for reducing resistance. An undesired oxide layer (not shown) also typically forms atop diffusion region 16. The deposited elemental titanium also functions to break-up this undesired oxide and thereafter form a titanium silicide with the silicon of substrate 12 to reduce contact resistance between active area 16 and subsequently deposited plug filling tungsten. Additionally, titanium layer 20 functions as an adhesion/nucleation layer for the subsequently deposited conductive material, for example tungsten. Tungsten does not readily deposit over silicon dioxide and exposed silicon substrate, and the intervening titanium layer 20 facilitates deposition and adhesion of tungsten thereto.

Titanium layer 20 is typically deposited by sputter deposition, and undesirably results in formation of contact projecting cusps 22. This results in a back or re-entrant angle 24 being formed relative to contact opening 18. A layer 26 of tungsten is subsequently deposited with the intent being to completely fill the remaining volume of contact opening 18. Unfortunately, an undesired keyhole 28 typically forms, leaving a void within contact 18.

Referring to FIG. 2, layers 26 and 20 are subsequently etched back by dry etch or chemical-mechanical polishing to form a contact-filling plug 30. Undesirably, this typically opens-up the upper end of keyhole 28. This undesirably creates a thin void which is difficult to clean and rinse during processing. Also in the final construction, the outer surface area of plug 30 is reduced due to the void created by keyhole 28. This counters the desired goal of maximizing electrical contact with plug 30 with a subsequent layer for ultimately making electrical connection with active area 16. Further, the etch back typically conducted to produce plug 30 undesirably over-etches titanium layer 20, forming edge "fangs" 32. Even where a desired overlying metal line and plug filling material constitute the same material deposited in a common step, undesired voids typically form within the contacts.

Prior art techniques have been developed which desirably cause some degree of reflow of the contact filling materials and/or overlying metal conductive lines to facilitate filling of contacts and eliminating voids. One such prior art method subjects the substrate to an extremely high pressure gas phase treatment within a sealed vessel. An example gas phase pressure is around 700 atmospheres and an example temperature of around 400° C. Such conditions apparently cause extrusion of the metal such that it reflows to a slight degree to completely fill contacts, yet without melting to a point of completely losing its previously patterned shape outside of the contacts. One industry process of doing so is referred to as a "force fill" process.

However, such extreme gas pressures and treatment vessels create considerable safety problems to all those working in the vicinity of such vessels. Specifically, if a gas leak or crack were to develop in the reactor vessel, the rapidly expanding gas flowing through such crack could cause the reactor to completely blow apart much like a bomb, or alternately turn the reactor into a lethal projectile.

It would be desirable to overcome these and other problems associated with formation of electrically conductive contact plugs. Although the invention principally arose out of concerns specific to contact filling, the artisan will appreciate that the invention has other applicability in semiconductor processing with the invention only be limited by the accompanying claims appropriately interpreted in accordance with the Doctrine of Equivalents.

SUMMARY OF INVENTION

In accordance with one aspect of the invention, a semiconductor processing method of treating a semiconductor wafer provides a wafer within a volume of liquid. The wafer has some electrically conductive material formed thereover. The volume of liquid within the chamber with the wafer therein is established at a pressure of greater than 1 atmosphere and at a temperature of at least 200° C., and below and within 10% of the melting point of the electrically conductive material. In accordance with another aspect, the volume of liquid within the chamber with the wafer therein is established at a pressure of greater than 1 atmosphere. After establishing the pressure of greater than 1 atmosphere, the pressure of the volume of liquid is lowered to a point effective to vaporize said liquid and the vapor is withdrawn from the chamber. In accordance with still another aspect, a semiconductor processing method of increasing planarity of an outer surface on a substrate comprises exposing the outer surface to a volume of liquid at a pressure of greater than about 200 atmospheres.

BRIEF DESCRIPTION OF THE DRAWINGS

Preferred embodiments of the invention are described below with reference to the/following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
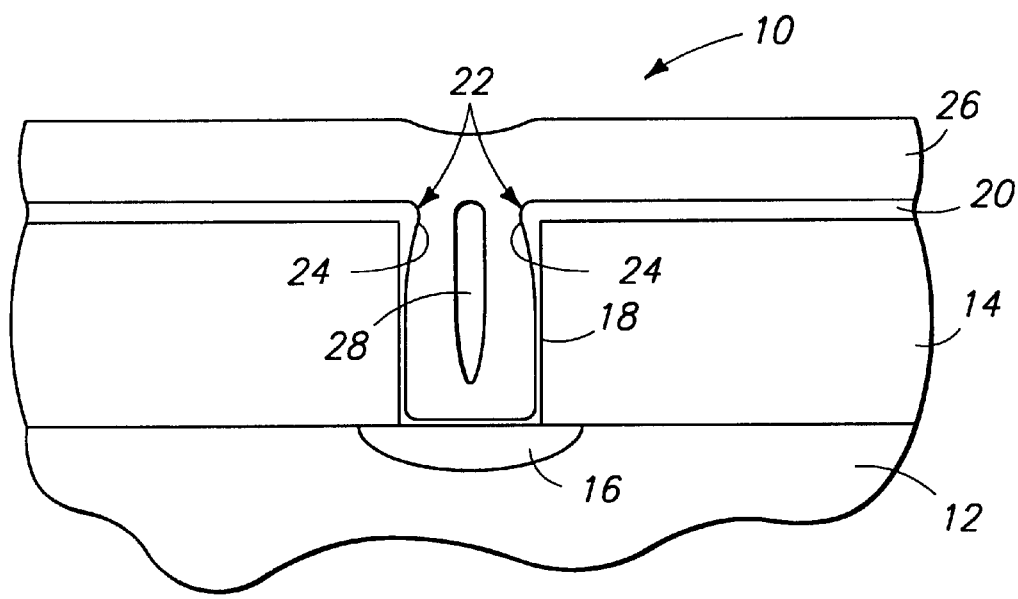
FIG. 1 is a diagrammatic sectional view of a prior art semiconductor wafer fragment, and is discussed in the "Background" section above.
Figure 2:
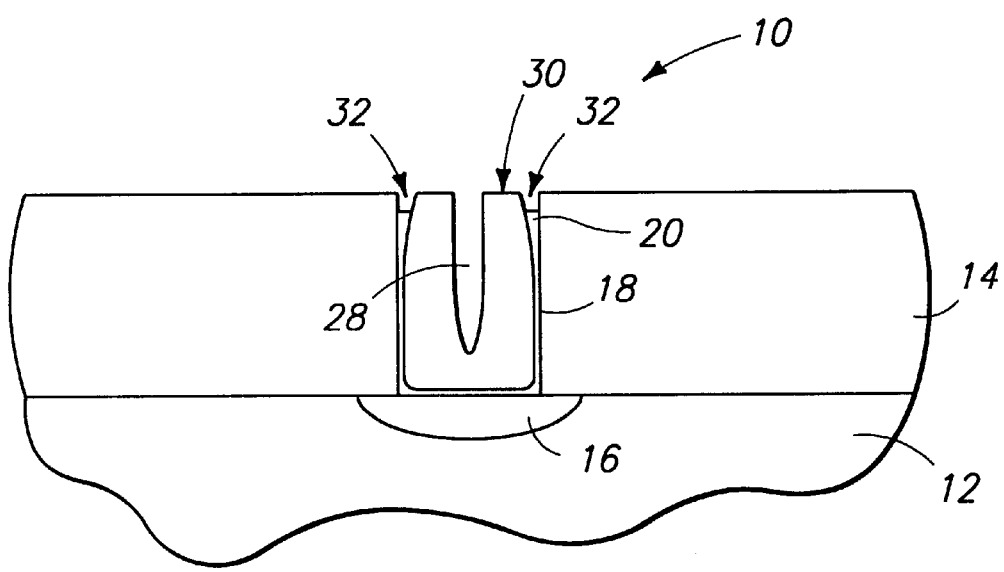
FIG. 2 is a view of the FIG. 1 wafer taken at a prior art processing step subsequent to that shown by FIG. 1.

In accordance with one aspect of the invention, the FIG. 1 or FIG. 2 wafer having a deposited electrically conductive material, is exposed to a liquid at a pressure greater than 1 atmosphere and at a temperature of at least 200 degrees C, and below and within 10% of the melting point of the electrically conductive material. Example and preferred electrically conductive materials for treatment include aluminum, copper, titanium, gold, silver, solder or mixtures/ alloys thereof. A goal of such treatment is to extrude the electrically conductive material within the contact opening to assure more substantial complete filling thereof, and preferably remove any voids therein. A preferred pressure for the liquid is greater than or equal to about 100 atmospheres, with greater than or equal to about 200 atmospheres being more preferred. Most preferred is a pressure greater than or equal to 500 atmospheres. A typical preferred treatment is expected to last anywhere from seconds up to ten minutes or more.

The liquid is ideally chosen to be some material which is substantially inert to the wafer material. The liquid is also preferably ii of a material which can be reasonably easily cleaned from the wafer. Examples include ethylene glycol, molten indium, mineral based hydraulic fluids, perfluorinated ethers, and perfluorinated alkanes.

Figure 3:
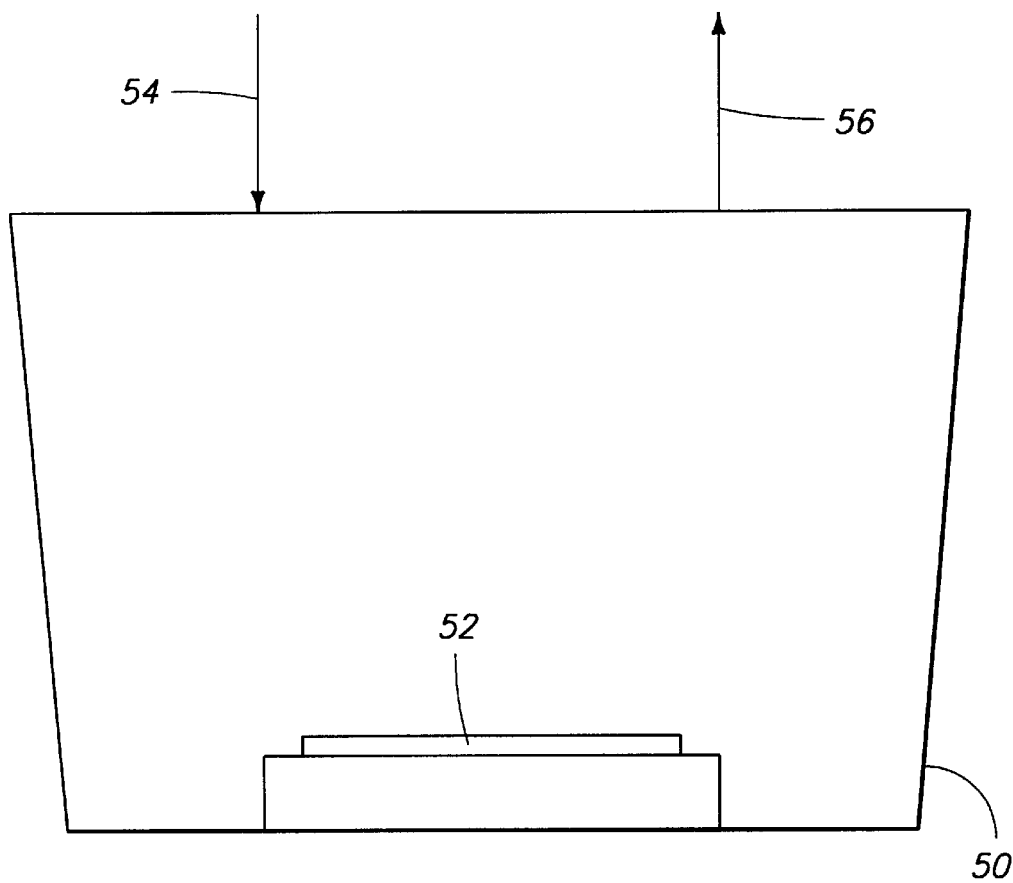
FIG. 3 is a diagrammatic representation of wafer processing in accordance with the invention.

FIG. 3 diagrammatically illustrates an example process in accordance with the invention. Such includes a treatment chamber 50 having a wafer 52 positioned therewith. A suitable liquid inlet 54 is provided for filling chamber 50 with liquid, and forcing suitable additional liquid thereto to effectively provide the liquid under the desired pressure. An outlet 56 is provided for pumping or otherwise evacuating the liquid from the chamber after treatment. One preferred manner of evacuating the liquid after the high pressure exposure treatment is to lower the pressure of the liquid within the chamber to a point effective to essentially vaporize the liquid away from the substrate and chamber. Temperature of the liquid could also be lowered in conjunction with the pressure lowering. As an example for ethylene glycol, if temperature were established at 150° C. after treatment, pressure could be lowered to the ethylene glycol vapor pressure at that temperature of 20.2 kPa (0.2 atm) to achieve vaporization. If temperature were established at 25° C. after treatment, pressure could be lowered to the ethylene glycol vapor pressure at that temperature of 0.010 kPa ($9.87 \times 10^{-5}$ atm or 75 mTorr) to achieve vaporization.

The invention is understood to have several significant potential advantages over the prior art high pressure gas phase treatment. For example, liquid surface tension exists between a liquid and a solid surface and is essentially nonexistent between a gas and a solid surface. Accordingly, liquid/solid systems inherently seek to minimize surface area such that surface tension is reduced. Whether attempting void filling reflow with high gas or now with high pressure liquid in accordance with the invention, exposed surface area of the treated material will be less at the conclusion of the subject treatment as compared to before the treatment. Therefore, the driving surface tension minimizing features inherent in a liquid/solid system will facilitate or drive a greater desired planarizing or reflow in a liquid system than a gas system.

Also, establishing the temperature with elevated pressure to within 10% of the melting point of the electrically conductive material facilitates reflow and planarization considerably more so than at lower temperatures.

Further, the subject liquid system is considerably safer than the high pressure gas phase system. This is principally due to the essential non-compressibility of liquids as compared to gases. There is no practical risk of uncontrollable or violent liquid expansion upon inadvertent release from the reactor with a liquid system as compared to a gas system as there has been no fundamental volume compression of the subject molecules in the first place. Accordingly, an inadvertent leak of a substantial isostatic system, while causing initial spraying of liquid, will not cause the explosive expansion of the prior art high pressure gas systems.

Further, a high pressure liquid treatment system in accordance with the invention is expected to put fewer particles or other contaminants into the system. For example with respect to the prior art high pressure gas treatment, gas is continuously fed into the reactor system until the point that a desired pressure is achieved. However, this doesn't occur in accordance with the liquid treatment system. The chamber is initially filled with liquid and then very little additional liquid must be added to get the pressure to go much higher than one atmosphere due to the non-compressible nature of liquids as compared to gases. Further, these features are expected to facilitate achieving a higher throughput of wafers for treatment than with the prior art high pressure gas treatments.

Although the invention was motivated in the context of contact filling associated with aluminum or other lines, the artisan will appreciate other utility of the invention. For example, the above described process can be utilized to increase the planarity of an outer surface on a substrate (i.e., an insulating oxide or other layer, or other conductive layer, or combination thereof, etc.). Pressures lower than 200 atmospheres might also be utilizable in some systems.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of treating a semiconductor wafer comprising:

providing the wafer within a liquid bath, the wafer having an electrically conductive material formed thereover; and establishing the liquid bath with the wafer therein at a pressure of greater than 1 atmosphere and at a temperature of at least 200° C., and below and within 10% of the melting point of the electrically conductive material.

2. The semiconductor processing method of claim 1 wherein the pressure is greater than or equal to about 100 atmospheres.

3. The semiconductor processing method of claim 1 wherein the pressure is greater than or equal to about 500 atmospheres.

4. The semiconductor processing method of claim 1 wherein the liquid is selected from the group consisting of ethylene glycol, molten indium, a mineral based hydraulic fluid, a perfluorinated ether and a perfluorinated alkane, or mixtures thereof.

5. The semiconductor processing method of claim 1 wherein the electrically conductive material comprises aluminum, copper or a mixture of aluminum and copper.

6. The semiconductor processing method of claim 1 wherein the electrically conductive material comprises titanium, gold, silver, solder or mixtures thereof.

7. A semiconductor processing method of treating a semiconductor wafer comprising:
providing the wafer within a liquid bath in a chamber, the wafer having an electrically conductive material formed thereover; and
establishing the liquid bath with the wafer therein at a pressure of greater than 1 atmosphere; and
after establishing the pressure of greater than 1 atmosphere, lowering the pressure of the liquid bath to a point effective to vaporize said liquid bath and withdrawing said vapor from the chamber.

8. The semiconductor processing method of claim 7 further comprising after establishing the pressure of greater than 1 atmosphere, also lowering the temperature of the liquid bath.

9. The semiconductor processing method of claim 7 wherein the pressure of greater than 1 atmosphere is greater than or equal to about 100 atmospheres.

10. The semiconductor processing method of claim 7 wherein the lowered pressure point is greater than 1 atmosphere.

11. The semiconductor processing method of claim 7 wherein the lowered pressure point is less than 1 atmosphere.

12. The semiconductor processing method of claim 7 wherein the liquid is selected from the group consisting of ethylene glycol, molten indium, a mineral based hydraulic fluid, a perfluorinated ether and a perfluorinated alkane, or mixtures thereof.

13. A semiconductor processing method of increasing planarity of an outer surface on a substrate comprising exposing the outer surface to a liquid bath at a pressure of greater than about 200 atmospheres.

14. The semiconductor processing method of claim 13 wherein the liquid bath is at a temperature of at least 200° C. and below the melting point of the material of the outer surface whose planarity is being increased.

15. The semiconductor processing method of claim 13 wherein the liquid bath is at a temperature of at least 200° C. and below and within 10% of the melting point of the material of the outer surface whose planarity is being increased.

16. The semiconductor processing method of claim 13 wherein the pressure is greater than or equal to about 500 atmospheres.

17. The semiconductor processing method of claim 13 wherein the liquid is selected from the group consisting of ethylene glycol, molten indium, a mineral based hydraulic fluid, a perfluorinated ether and a perfluorinated alkane, or mixtures thereof.

18. The semiconductor processing method of claim 1 wherein the liquid bath comprises ethylene glycol.

19. The semiconductor processing method of claim 1 wherein the liquid bath comprises molten indium.

20. The semiconductor processing method of claim 1 wherein the liquid bath comprises a mineral based hydraulic fluid.

21. The semiconductor processing method of claim 1 wherein the liquid bath comprises a perfluorinated ether.

22. The semiconductor processing method of claim 1 wherein the liquid bath comprises a perfluorinated alkane.

23. The semiconductor processing method of claim 7 wherein the liquid bath comprises ethylene glycol.

24. The semiconductor processing method of claim 7 wherein the liquid bath comprises molten indium.

25. The semiconductor processing method of claim 7 wherein the liquid bath comprises a mineral based hydraulic fluid.

26. The semiconductor processing method of claim 7 wherein the liquid bath comprises a perfluorinated ether.

27. The semiconductor processing method of claim 7 wherein the liquid bath comprises a perfluorinated alkane.

28. The semiconductor processing method of claim 13 wherein the liquid bath comprises ethylene glycol.

29. The semiconductor processing method of claim 13 wherein the liquid bath comprises molten indium.

30. The semiconductor processing method of claim 13 wherein the liquid bath comprises a mineral based hydraulic fluid.

31. The semiconductor processing method of claim 13 wherein the liquid bath comprises a perfluorinated ether.

32. The semiconductor processing method of claim 13 wherein the liquid bath comprises a perfluorinated alkane.

33. The semiconductor processing method of claim 1 wherein the electrically conductive material comprises titanium.

34. The semiconductor processing method of claim 1 wherein the electrically conductive material comprises gold.

35. The semiconductor processing method of claim 1 wherein the electrically conductive material comprises silver.

36. The semiconductor processing method of claim 1 wherein the electrically conductive material comprises solder.

* * * * *

UNITED STATES PATENT AND TRADEMARK OFFICE
CERTIFICATE OF CORRECTION

PATENT NO. : 6,333,264 B1
DATED : December 25, 2001
INVENTOR(S) : David A. Cathey et al.

It is certified that error appears in the above-identified patent and that said Letters Patent is hereby corrected as shown below:

Column 3,
Line 43, replace "preferably ii of a material" with -- preferably of a material --

Signed and Sealed this

Eleventh Day of March, 2003

JAMES E. ROGAN
*Director of the United States Patent and Trademark Office*